(12) United States Patent
Nagatomo et al.

(10) Patent No.: US 7,449,689 B2
(45) Date of Patent: Nov. 11, 2008

(54) DIMENSION MEASURING SEM SYSTEM, METHOD OF EVALUATING SHAPE OF CIRCUIT PATTERN AND A SYSTEM FOR CARRYING OUT THE METHOD

(75) Inventors: Wataru Nagatomo, Yokohama (JP);
Ryoichi Matsuoka, Yotsukaido (JP);
Takumichi Sutani, Hitachinaka (JP);
Akiyuki Sugiyama, Hitachinaka (JP);
Yasuhiro Yoshitake, Yokohama (JP);
Hideaki Sasazawa, Yokohama (JP)

(73) Assignee: Hitachi High-Technologies Corporation, Tokyo (JP)

( * ) Notice: Subject to any disclaimer, the term of this patent is extended or adjusted under 35 U.S.C. 154(b) by 216 days.

(21) Appl. No.: 11/260,082

(22) Filed: Oct. 28, 2005

(65) Prior Publication Data
US 2006/0108524 A1 May 25, 2006

(30) Foreign Application Priority Data
Oct. 29, 2004 (JP) ............................ 2004-315126

(51) Int. Cl.
*G03F 1/00* (2006.01)
*G21K 7/00* (2006.01)

(52) U.S. Cl. .......................................... 250/310; 430/5
(58) Field of Classification Search ................ 250/310, 250/492.22; 382/144, 145; 356/237.5, 237.6; 430/5, 30; 716/21
See application file for complete search history.

(56) References Cited

U.S. PATENT DOCUMENTS

| | | | | |
|---|---|---|---|---|
| 5,825,647 | A * | 10/1998 | Tsudaka | 430/5 |
| 6,154,563 | A * | 11/2000 | Tsudaka | 382/144 |
| 6,249,597 | B1 * | 6/2001 | Tsudaka | 382/144 |
| 6,492,066 | B1 * | 12/2002 | Capodieci et al. | 430/5 |
| 6,510,730 | B1 * | 1/2003 | Phan et al. | 73/105 |
| 6,829,380 | B1 * | 12/2004 | Choo et al. | 382/144 |
| 2002/0194576 | A1 * | 12/2002 | Toyama | 716/21 |
| 2003/0082463 | A1 * | 5/2003 | Laidig et al. | 430/5 |
| 2004/0123265 | A1 * | 6/2004 | Andreev et al. | 716/21 |
| 2007/0117030 | A1 * | 5/2007 | Laidig et al. | 430/5 |

FOREIGN PATENT DOCUMENTS

| | | |
|---|---|---|
| JP | 8-160598 | 6/1996 |
| JP | 2000-58410 | 2/2000 |
| JP | 2002-31525 | 1/2002 |
| JP | 2002-81914 | 3/2002 |
| JP | 2002-353280 | 12/2002 |
| JP | 2003-16463 | 1/2003 |
| JP | 2003-21605 | 1/2003 |
| JP | 2004-228394 | 8/2004 |

\* cited by examiner

*Primary Examiner*—Nikita Wells
*Assistant Examiner*—Johnnie L Smith, II
(74) *Attorney, Agent, or Firm*—Antonelli, Terry, Stout & Kraus, LLP.

(57) ABSTRACT

The present invention relates to a dimension measuring SEM system and a circuit pattern evaluating system capable of achieving accurate, minute OPC evaluation, the importance of which increase with the progressive miniaturization of design pattern of a circuit pattern for a semiconductor device, and a circuit pattern evaluating method. Design data and measured data on an image of a resist pattern formed by photolithography are superposed for the minute evaluation of differences between a design pattern defined by the design data and the image of the resist pattern, and one- or two-dimensional geometrical features representing differences between the design pattern and the resist pattern are calculated. In some cases, the shape of the resist pattern differs greatly from the design pattern due to OPE effect (optical proximity effect). To superpose the design data and the measured data on the resist pattern stably and accurately, an exposure simulator calculates a simulated pattern on the basis of photomask data on a photomask for an exposure process and exposure conditions and superposes the simulated pattern and the image of the resist pattern.

20 Claims, 13 Drawing Sheets

DIMENSION MEASURING SEM SYSTEM, METHOD OF EVALUATING SHAPE OF CIRCUIT PATTERN AND A SYSTEM FOR CARRYING OUT THE METHOD

BACKGROUND OF THE INVENTION

Field of the Invention

The present invention relates to a dimension measuring SEM system for measuring the dimensions of components of a circuit pattern formed on a semiconductor wafer by a photolithographic process to evaluate the circuit pattern, a pattern evaluating method of evaluating the shape of a circuit pattern and a pattern evaluating system for carrying out the pattern evaluating method. More specifically, the present invention relates to a pattern evaluating method of evaluating a circuit pattern formed on a semiconductor wafer through the comparison of the circuit pattern formed on the semiconductor wafer with a circuit pattern of a desired design, and a pattern evaluating system for carrying out the pattern evaluating method.

A semiconductor device fabricating process forms an image of a device pattern or a circuit pattern, namely, a wiring pattern, designed by using a CAD system and formed on a photomask, namely, a reticle, on a wafer to form a semiconductor device. The recent advanced integrated circuit technology for forming miniaturized devices requires further dimensional reduction of wiring lines. The device miniaturization requires forming a circuit pattern having lines of a line width smaller than the wavelength of radiation radiated by an exposure light source. Thus printing a fine circuit pattern formed on a photomask on a resist film in a desired high resolution has become progressively difficult. Consequently, a resist pattern 102 formed by exposing a resist film through a photomask provided with a circuit pattern 101 to exposure radiation differs greatly from the circuit pattern 101 of the photomask as shown in FIG. 1.

For example, a circular shape 104 is printed on the resist film when the resist film is exposed through a square shape 103 formed on a photomask, and a bent line 102 having rounded corners 106 are formed on the resist film when the resist film is exposed through a bent line 101 having rectangular corners 105. Moreover, a circuit pattern having regularly alternately arranged rectangular lines of predetermined dimensions and rectangular spaces of predetermined dimensions formed on a photomask is printed on a resist film in a circuit pattern having irregularly alternately arranged rectangular lines of dimensions different from those of the rectangular lines on the photomask and rectangular spaces of dimensions different from those of the spaces formed on the photomask.

The shape deterioration of the resist pattern is due to a physical phenomenon called an optical proximity effect (OPE) The shape deterioration of the resist pattern causes the malfunction of semiconductor devices. Effort is made to form the resist pattern in an improved shape by intentionally properly deforming a mask pattern formed on the photomask. For example, to improve the resist pattern, a method forms a minute corrected circuit pattern that is not printed on the resist film contiguously with or in the proximity of the mask pattern formed on the photomask and another method forms a mask pattern having parts having dimensions greater or smaller than design dimensions on the photomask.

Such correcting techniques will be called optical proximity correction techniques (OPC techniques). Resist patterns formed by the OPC techniques are used for forming extremely miniaturized semiconductor devices. The slight difference between the design shape of the mask pattern and the actual shape of the resist pattern affects significantly on the ability of semiconductor devices. Thus the difference between the mask pattern and the resist pattern is an important problem of quality control. To solve such a problem, the widths of the lines forming the circuit pattern formed on a wafer are measured by a length-measuring SEM system, and the measured widths of the lines are used for the optimization of photomask designing, exposure and process conditions. Further dimensional reduction of design circuit patterns is expected in the future. Therefore, there is a need for a measuring method and an evaluating method capable of grasping the minute condition of shapes of resist patterns.

Techniques for evaluating circuit patterns formed on semiconductor wafers are disclosed in JP-A 2002-31525, JP-A 2002-353280 and JP-2004-228394. Related arts are disclosed in JP-A 8-160598, JP-A 200-58410, JP-A 2002-81914, JP-A 2003-16463 and JP-A 2003-21605.

As mentioned above, the dimensional reduction of semiconductor devices and wiring lines has been achieved by the advanced integrated circuit technology relating with the semiconductor device fabricating process and the OPC technique relating with miniaturization techniques has been applied to forming circuit patterns. The geometrical features of minute circuit patterns, such as the roundness of corners of circuit patterns and distances between adjacent lines of circuit patterns, affect the ability of semiconductor devices. The quality of resist patterns cannot be satisfactorily evaluated through the dimensional measurement of the resist patterns by known measuring techniques.

SUMMARY OF THE INVENTION

The present invention provides a dimension measuring SEM system, a method of evaluating the shape of a circuit pattern and a system for carrying out the method capable of evaluating the quality of a minute circuit pattern formed by the OPC technique, namely, a miniaturizing technique.

The present invention provides a circuit pattern evaluating system, for carrying out a circuit pattern evaluating method of evaluating the shape of a circuit pattern, including an electronic or optical microscope for obtaining measured data on a printed circuit pattern corresponding to a mask pattern formed on a mask, namely, mask pattern, and formed on a substrate by an exposure process executed by an exposure system under predetermined exposure conditions; an input means for entering design data on the mask pattern provided by a CAD system or the like; and an evaluation index calculating means for processing the design data on the mask pattern and the measured data on the printed circuit pattern provided by the microscope by a superposition process and calculating evaluation indices for the evaluation of the OPC of the mask pattern (hereinafter, referred to as "OPC evaluation") through the quantification of one- or two-dimensional geometrical features indicating the difference between the design data and the measured data.

The present invention provides a dimension measuring SEM system, for obtaining measured data on a printed circuit pattern formed on a substrate by an exposure system under predetermined exposure conditions, including an input means for entering design data on a mask pattern provided by a CAD system or the like; and an evaluation index calculating means for processing the design data on the mask pattern entered by the input means and the measured data on the printed circuit pattern provided by the microscope by a superposition process and calculating evaluation indices for the OPC evaluation through the quantification of one- or two-dimensional geometrical features indicating the difference between the design data and the measured data.

The dimension measuring SEM system according to the present invention further includes an input means for entering the exposure conditions and the design data on the mask pattern formed on the photomask, produced by a photomask designing unit; and a exposure simulator for calculating data on the printed circuit pattern formed by an exposure process based on the design data, on the mask pattern formed on the photomask, entered by the input means and the predetermined exposure conditions; wherein the evaluation index calculating means subjects the data on the printed circuit pattern obtained by the exposure simulator and the measured data on the printed circuit pattern provided by the pattern measuring SEM system to a matching process to calculate a position of data on a transfer circuit pattern in high correlation with the measured data on the printed circuit pattern provided by the pattern measuring SEM system through, for example, calculation of correlation, and the design data on the mask pattern and the measured data, on the printed circuit pattern, measured by the dimension measuring SEM system by replacing the calculated data on the printed circuit pattern with the design data on the mask pattern.

The present invention calculates the accurate, specific evaluation indices necessary for OPC evaluation on the basis of a measured image of the printed circuit pattern, namely, a resist pattern. Thus, detailed evaluation of the circuit pattern which could not have hitherto been achieved can be achieved and the efficiency of photomask designing can be improved.

Since the evaluation indices are quantitative, efficient evaluation is possible.

These and other objects, features and advantages of the invention will become apparent from the following more particular description of preferred embodiments of the invention, as illustrated in the accompanying drawings.

DESCRIPTION OF THE PREFERRED EMBODIMENTS

A dimension measuring SEM system capable of evaluating the quality of a minute resist pattern formed on a semiconductor wafer by a photolithographic process, a pattern shape evaluating system and a pattern shape evaluating method in preferred embodiments according to the present invention will be described with reference to the accompanying drawings.

The present invention intends to quantify the difference between an image data, on a printed circuit pattern formed by a photolithographic process, measured by an electronic or optical microscope system and design data on a mask pattern and to calculate geometrical features representing the shape of a circuit pattern.

Slight errors in a minute circuit pattern affect the performance of a semiconductor device. Therefore, the geometrical features of a resist pattern, namely, a printed circuit pattern formed by photolithography, must be accurately determined and hence it is desirable to superpose circuit pattern design data on a designed circuit pattern and measured pattern data on a resist pattern by an accurate a superposition process. However, in some cases, the shape of the resist pattern differs greatly from the design circuit pattern. In such a case, it is difficult to superpose the design circuit pattern and the resist pattern accurately.

The present invention provides a superposing method capable of accurately superposing design data on the design circuit pattern and measured data on the resist pattern to calculate accurately geometrical features for the evaluation of the quality of a minute circuit pattern.

OPC Evaluating Procedure

Figure 1:
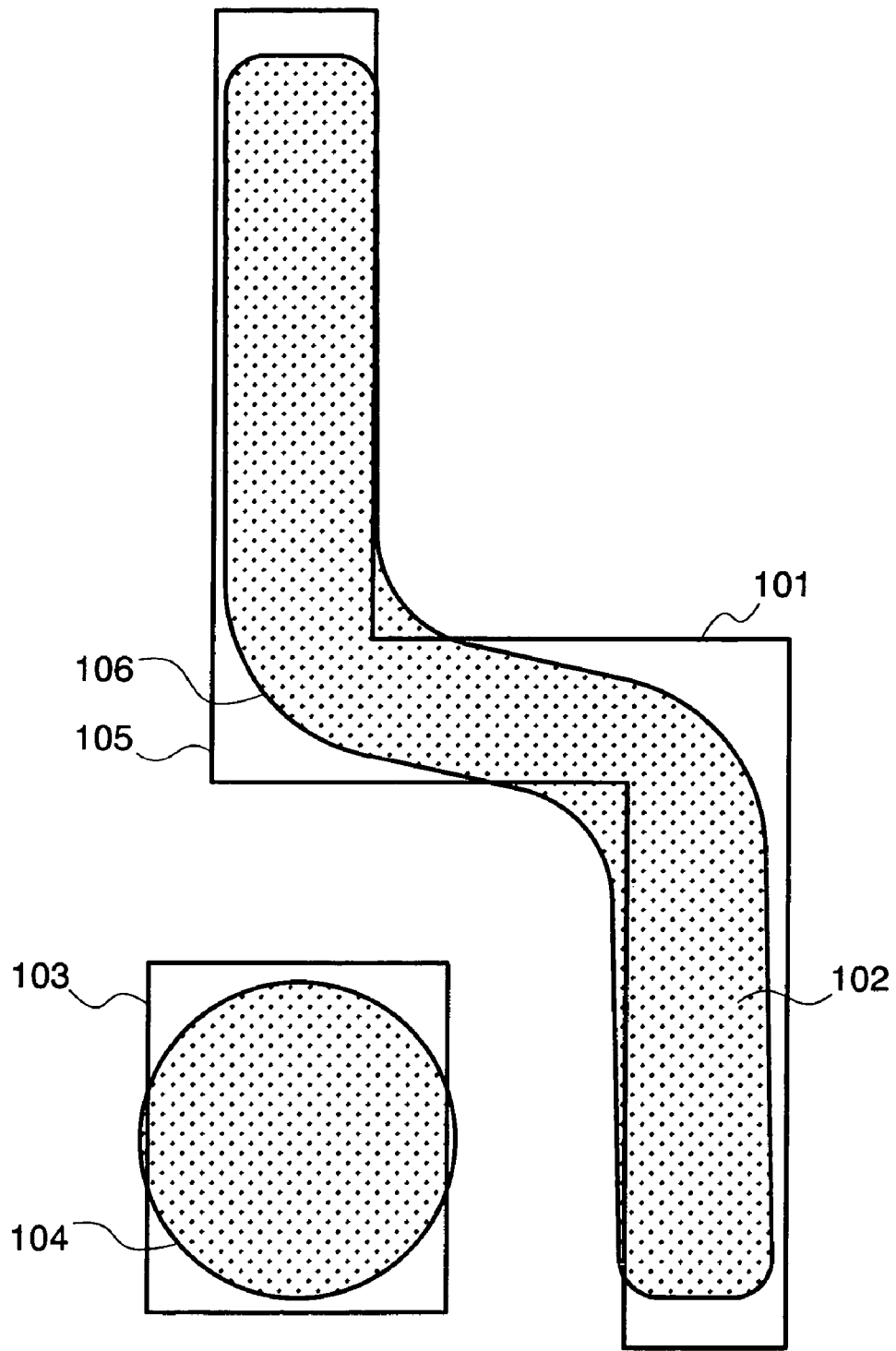
FIG. 1 is a pictorial view of assistance in explaining the relation between a mask pattern and a resist pattern, namely, a printed circuit pattern formed by exposing a photo resist film through a photomask to exposure radiation.
Figure 2:
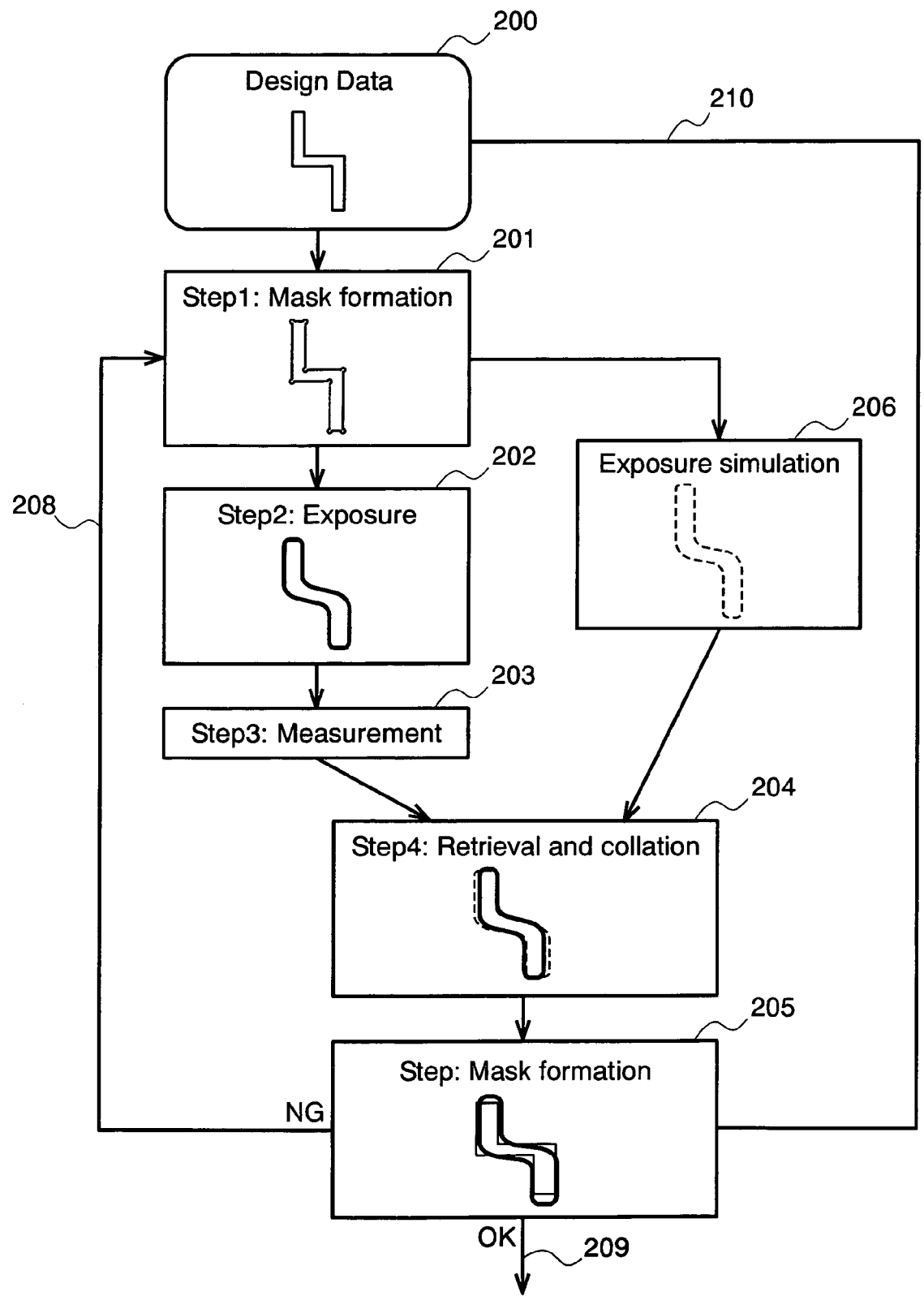
FIG. 2 is a block diagram of an OPC evaluating procedure according to the present invention.

FIG. 2 is a block diagram of an OPC evaluating procedure according to the present invention to be carried out by a photolithographic process.

The flow of the steps of the OPC evaluating procedure will be described. A mask designing unit 517 shown in FIG. 5 designs a photomask pattern on the basis of design data 200 on a design circuit pattern of a desired design, taking into consideration an OPE in step 201. A photomask provided with the design circuit pattern is formed on the basis of the design data 200. An exposure system 519 shown in FIG. 5 exposes a resist film formed on a semiconductor wafer through the photomask to exposure radiation to form a latent image of the design circuit pattern in the resist film in step 202. The exposed resist film is processed by photolithography to form a resist pattern on the semiconductor wafer. A dimension measuring SEM system shown in FIG. 5 measures the resist pattern to obtain SEM image data in step 203.

The dimension measuring SEM system is used to measure the resist pattern and to obtain the SEM image because the widths of component lines of the minute resist pattern formed on the semiconductor wafer are in the range of 80 to 100 nm or 30 to 65 nm. If the widths of the component lines are not less than about 100 nm, an image for dimensional measurement can be obtained by an optical microscope, such as an ultraviolet optical microscope.

Figure 5:
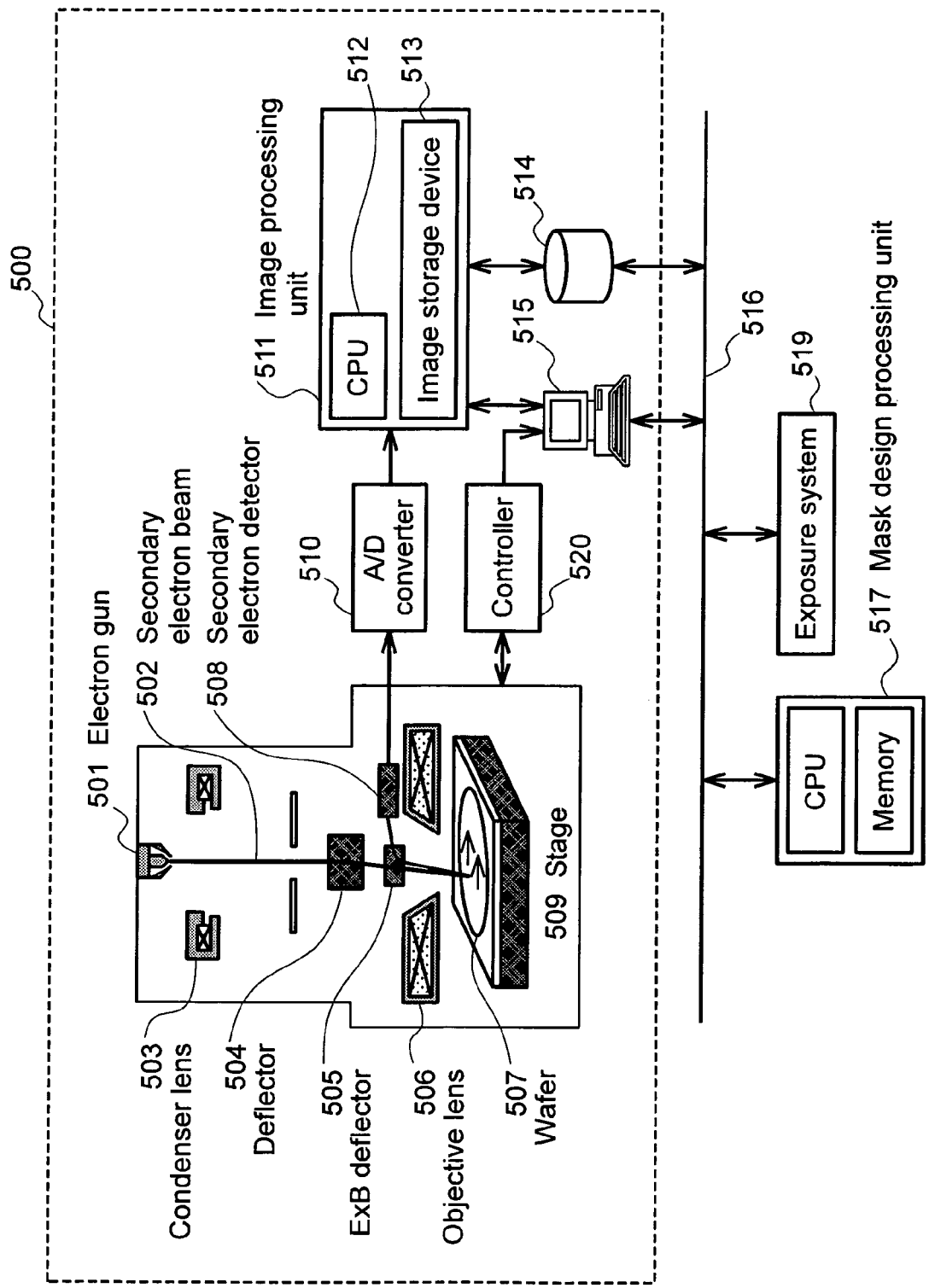
FIG. 5 is a block diagram of a dimension measuring SEM system or a shape evaluation system for evaluating circuit patterns according to the present invention.

In step 204, an image processing unit 511 shown in FIG. 5 performs retrieving, collating and superposing operations to superpose a simulated circuit pattern provided by an exposure simulation process 206 based on the design data 200 provided by the photomask designing unit 517 or a CAD system and the SEM image provided by the dimension measuring SEM system in step 203 for a matching process. In step 205, the difference between the design circuit pattern conforming to the design data and the SEM image of the resist pattern is determined to evaluate the quality of the resist pattern. Results of evaluation of the resist pattern, namely, OPC evaluation indices for evaluating OPC points, are given to a workstation 515, namely, a controller. The results of evaluation are displayed on a screen of a GUI. If the resist pattern meets quality criteria, the semiconductor wafer is sent to the next process in step 209.

If the resist pattern does not meet the quality criteria, information about the unacceptable resist pattern is fed back to the photomask designing unit 517 in step 208. Then steps 201 to 205 are repeated until a desired resist pattern is formed. The quality criteria are references for deciding whether or not the deviations of the data on the formed resist pattern from the design data are within the corresponding tolerances that ensure the normal operation of a desired circuit. The quality criteria are determined taking into consideration the operating characteristics of a designing circuit when the design data 200 is provided or in step 201 for designing the mask pattern.

OPC evaluation will be described.

CAD/SEM Superposing Process

A method of positioning general measurement points on the dimension measuring SEM system stores the positional relation (directions and distances) of the evaluation points with respect to an aligned circuit pattern formed on the wafer and shifts a beam from the aligned circuit pattern to the evaluating point. When a high magnification, at which a measurement field is in the range of 0.5 to 5 μm, is used for OPC evaluation, the accuracy of superposition of the CAD data and the data on the resist pattern deteriorates due to an error in the movement of the stage or the beam from the alignment stage to the evaluation point. The CAD data and the data on the resist pattern are superposed by the following superposing process for the accurate superposition suitable for the minute OPC evaluation in an accuracy on the order of several nanometers.

Figure 3:
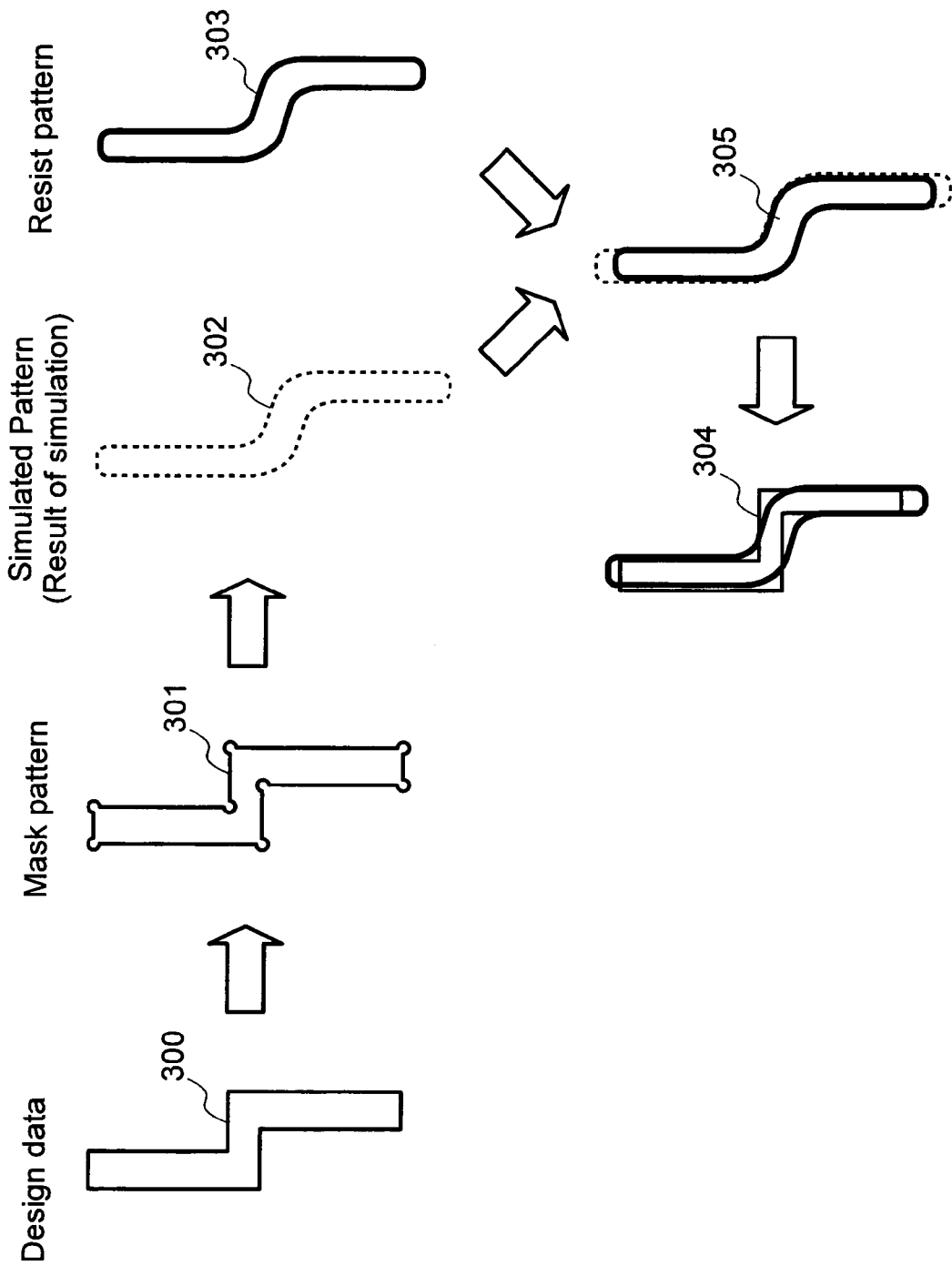
FIG. 3 is a pictorial view of assistance in explaining a superposition process according to the present invention to be executed by an exposure simulator.

A superposing process for superposing the design data and the data on the SEM image of the resist pattern will be described. The evaluation of the quality of the resist pattern in step 205 shown in FIG. 2 is achieved through the determination of the difference between the design circuit pattern 300 defined by the design data and the SEM image 303 of the resist pattern. As shown in FIG. 3, the design circuit pattern 300 defined by the design data and the SEM image 303 of the resist pattern are superposed by a superposing step 304, and differences between the design circuit pattern 300 and the SEM image 303 are quantified. The superposing process is achieved by subjecting the design circuit pattern 300 and the SEM image 303 to a matching process. The design circuit pattern 300 and the SEM image are estranged greatly from each other in most cases due to the OPE of the exposure process. Consequently, in some cases, the superposition of the design circuit pattern 300 and the SEM image 304 results in failure or the design circuit pattern 300 defined by the design data and the SEM image 303 cannot be accurately superposed.

It is desirable that the design circuit pattern 300 and the SEM image 303 of the resist pattern are accurately superposed. The present invention calculates a simulated circuit pattern 302 that may be formed when the resist film is exposed to exposure radiation through a photomask provided with the design circuit pattern 300 the by the exposure simulation process 206 (FIG. 2) executed by an exposure simulator included in the workstation 515. The simulated circuit pattern 302 and SEM image 303 of the resist pattern are subjected to a matching process 305 to improve the accuracy of positioning. The shape of the simulated circuit pattern 302 is closer to the SEM image 303 than that of the design circuit pattern 302 and hence the use of the simulated circuit pattern 302 instead of the design circuit pattern 300 is effective in improving the positioning accuracy.

The superposing process will be described in connection with FIG. 3. The exposure simulator included in the workstation 515 calculates pattern data on the simulated circuit pattern 302 to be formed by simulation on the semiconductor wafer on the basis of the mask pattern data on a mask pattern 301 calculated by the photomask designing unit 517 on the basis of the design data defining the design circuit pattern 300. The calculated simulated circuit pattern 302 and the actual resist pattern 303 are subjected to the matching process to superpose the simulated circuit pattern 302 and the resist pattern 303 as indicated at 305. The positional relation between the simulated circuit pattern 302 calculated on the basis of the mask pattern 301, and the design circuit pattern 300 defined by the design data is known and is stored previously in the exposure simulator. For example, OPC evaluation to be made by the image processing unit 511 replaces the simulated circuit pattern 302 with the design circuit pattern 300 to superpose the design circuit pattern 300 and the resist pattern 303 as indicated at 304.

A method of calculating the simulated circuit pattern formed by exposure simulation will be described with reference to FIG. 4. Mask data 401 and exposure conditions including the wavelength λ of exposure radiation, the numerical aperture NA of the objective lens, the apparent size σ of the light source (partial coherence) and at least one of conditions related with defocus are entered into the exposure simulator of the workstation 515 to calculate a light intensity distribution 403 when design photomask data is used for exposure. The exposure simulator included in the workstation 511 is provided with an input means for entering the mask data 401 and the exposure conditions. As shown in FIG. 5, the mask data 401 maybe entered by the photomask designing unit 517 through a network 516 into the exposure simulator of the workstation 515. The exposure conditions may be entered by the exposure system 519 through the network 516 into the exposure simulator of the workstation 515. The input means includes the photomask designing unit 517, the exposure system 519 and the network 516.

Figure 13:
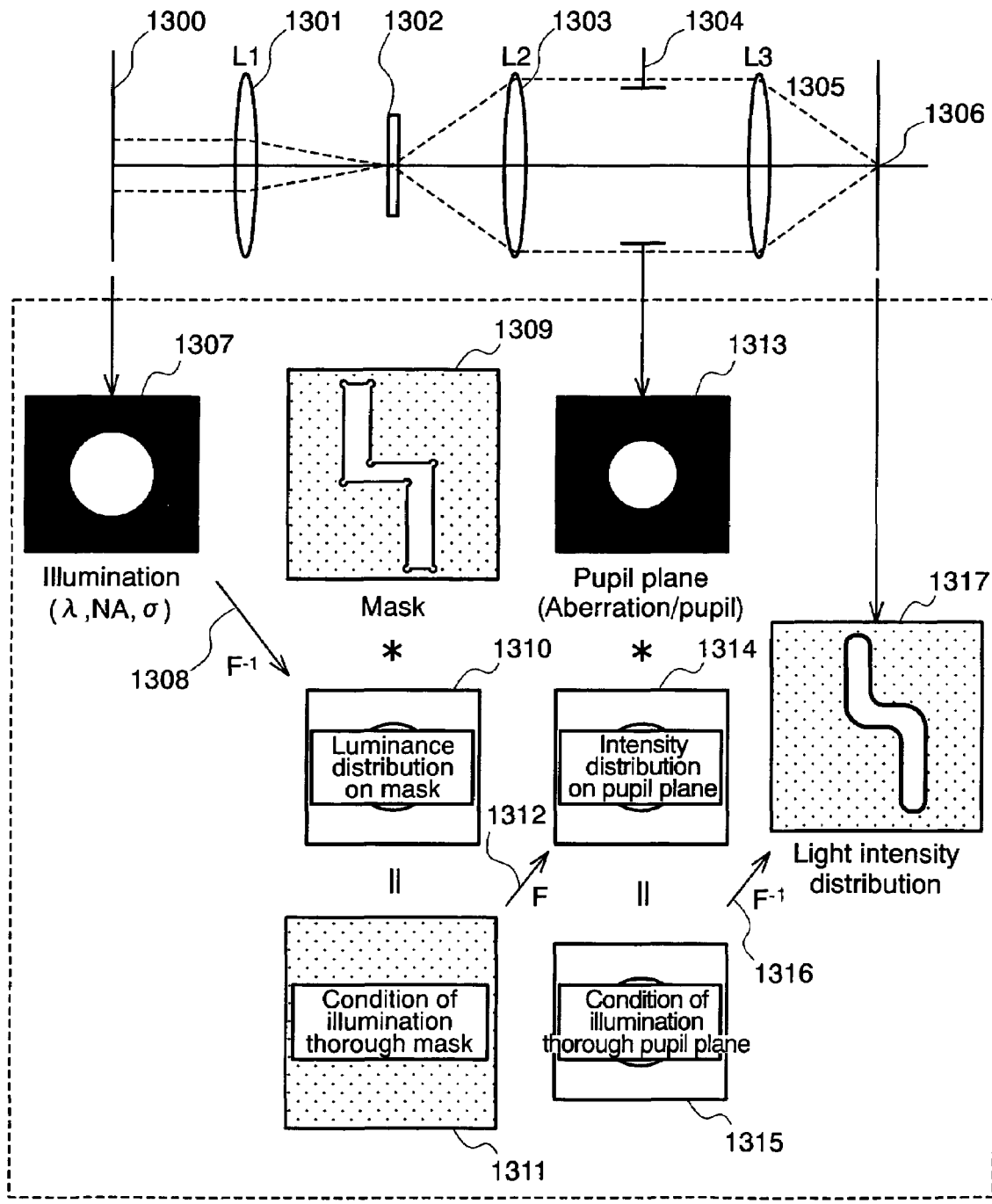
FIG. 13 is a block diagram of assistance in explaining an exposure simulation process to be executed by an exposure simulator according to the present invention.

The exposure simulator will be described. The exposure simulator calculates the light intensity distribution 403 shown in FIG. 4 that will occur when a design photomask, namely, a reticle, defined by the design photomask data is used on the basis of the mask data 401 on the photomask used for forming the resist pattern, namely, an object of measurement, and the exposure conditions. FIG. 13 shows an optical exposure system and an exposure simulation model. Light rays emerged from an illumination plane 1300 travel through a lens L1 (1301) and fall on a reticle 1302 provided with a mask pattern. The lens L1 (1301) and a lens L2 (1302) form an image of the illumination plane 1301 on a pupil plane 1304. The lens L2 (1303) and a lens L3 (1305) forms an image of the reticle 1302 on an object plane on an image plane 1306. The operations of the lenses of this optical system can be modeled by Fourier transform and inverse Fourier transform. A model from the illumination plane 1300 to the object plant 1302, a model from the pupil plane 1304 to the image plane 1306 correspond to Fourier transform and inverse Fourier transform, respectively. A picture surrounded by broken lines in FIG. 13 shows the flow of step of simulation based on such correspondence. Steps 1 to 6 of simulation will be described.

Step 1: The shape 1307 of a light source is determined on the basis of conditions for illumination including the wavelength λ of light, the numerical aperture NA of the objective lens and the apparent size σ of the light source.

Step 2: An illuminance distribution 1310 on the object plane is determined through the inverse Fourier transform of the shape 1307 of the light source.

Step 3: The mask pattern 1309 (401) formed on the reticle is multiplied by the illuminance distribution 1310 calculated in step 2 to determine the illuminated state 1311 of the mask pattern.

Step 4: The result of calculation in step 3 is subjected to Fourier transform 1312 to obtain a diffraction image 1314 of the mask pattern on the pupil plane.

Step 5: The pupil plane 1313 is multiplied by the calculated data 1314 obtained in step 4 to determine a diffraction image 1315 behind the pupil plane.

Step 6: The diffraction image 1315 determined in step 5 is subjected to inverse Fourier transform 1316 to obtain a circuit pattern 1317 on the image plane.

The shape of the photomask formed on the reticle and the size of the pupil are specified optionally on the basis of the shape of illumination, the numerical aperture NA, the wavelength λ of the illuminating light, the apparent size σ of the light source and the design circuit pattern 300 defined by the design data. Then, the exposure simulator of the workstation 515 calculates the light intensity distribution 1317 (403) formed by exposure under the specified exposure conditions and using the photomask. The calculated light intensity distribution can be stored in, for example, a storage device 514.

Description will be made of application of the calculated light intensity distribution 1317 (403) calculated by the exposure simulator of the workstation 515 shown in FIG. 5 to the superposition of the design data, namely, CAD data provided by the CAD system, and the SEM image. The exposure simulator of the workstation 515 slices of a part 402, corresponding to a light intensity, of the calculated light intensity distribution 1317 (403) and gives the sectional shape of the part 402 as a simulated circuit pattern 404 (302) to an image storage device 513.

A CPU 512 included in the image processing unit (evaluation index calculating means) processes the simulated circuit pattern 404 stored in the image storage device 513 and the SEM image 303 of the resist pattern by a matching process to calculate superposing positions where the simulated circuit pattern and the resist pattern are superposed.

A matching method to be carried out by the CPU 512 of the image processing unit 511, namely, the evaluation index calculating means, calculates an edge image from the images of the simulated circuit pattern and the SEM image, subjects the images to a matching process through the calculation of the correlation between the images, and uses a position that maximizes the value of correlation as a superposing position.

Another method makes the exposure simulator of the workstation 515 take slices respectively corresponding to different light intensities 405 and calculate the sectional shapes of the slices, stores the sectional shapes in the image storage device 513, and makes the image processing unit 511 match each of the sectional shapes of the slices stored in the image storage deice 513 and the SEM image 303 of the resist pattern. This method is able to achieve matching the simulated circuit pattern 302 similar to the resist pattern and the SEM image 303 of the resist pattern. Thus the position of the simulated circuit pattern 302 for positioning the design circuit pattern 300 defined by the design data relative to the SEM image 303 of the resist pattern can be accurately determined and thereby the accuracy of superposition of the design circuit pattern 300 defined by the design data and the SEM image 303 of the resist pattern can be further improved. This matching method using image processing is not limitative. Thus the image processing unit 511 achieves the accurate superposition of the design circuit pattern 300 defined by the design data and the resist pattern 303.

Figure 4:
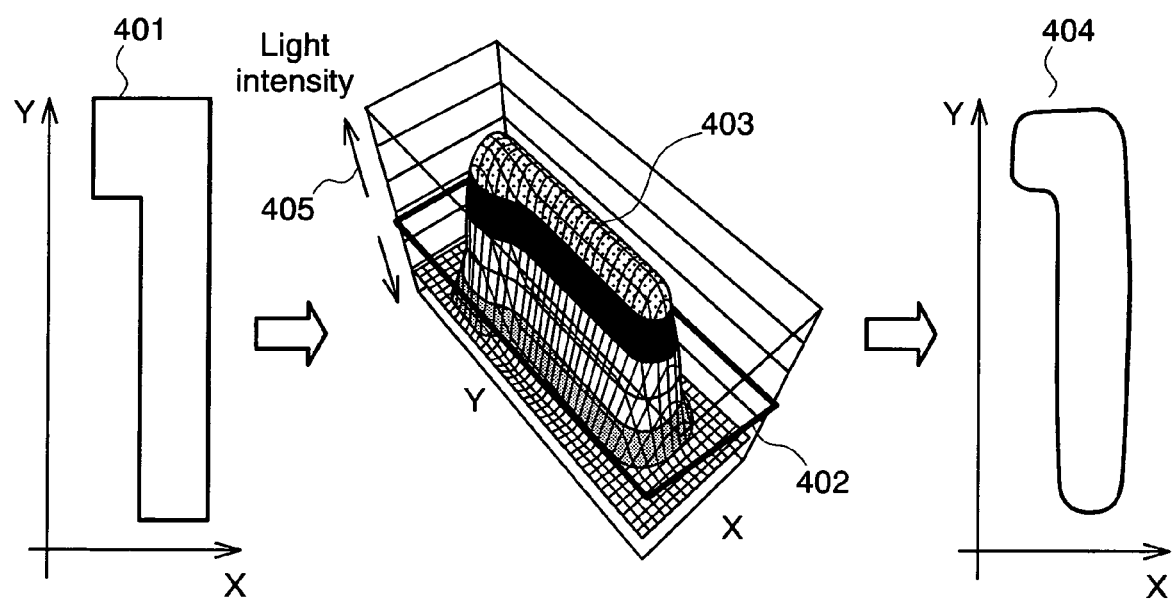
FIG. 4 is a diagrammatic view of assistance in explaining en exposure simulation procedure according to the present invention.

As shown in FIG. 4, the light intensity distribution 403 determined through exposure simulation is a light intensity distribution continuous in a surface of the wafer, namely, an X-Y plane in FIG. 4. The sectional shape 404 of a sliced part, corresponding to a proper light intensity, of the light intensity distribution 403, as compared with the design circuit pattern, is close to the SEM image (top-down view) of the resist pattern. The exposure simulator of the workstation 515 slices off parts of the light intensity distribution respectively corresponding to different light intensities and stores the sectional shapes of the sliced parts in the image storage device 513. The image processing unit 511 superposes the sectional shapes of the sliced parts on the SEM image of the resist pattern to select the sectional shape that is the closest to the SEM image. Accurate CAD-SEM superposition can be achieved by using the sectional shape thus selected for a CAD-SEM matching process for matching the design circuit pattern 300 defined by CAD data and the SEM image 303. More specifically, a light intensity at which a part of the light intensity distribution is sliced off is varied, edge images of the sections of sliced parts and an edge image of the SEM image of the resist pattern are matched for normalized correlation, and the result of matching of the SEM image of the resist pattern and the slice having the greatest value of correlation is used as a matching result.

Dimension Measuring SEM System (Dimensional Circuit Pattern Evaluating System)

A dimension measuring SEM system and peripheral devices for OPC evaluation according to the present invention will be described. FIG. 5 is a block diagram of the dimension measuring SEM system. In FIG. 5, components for exercising an OPC evaluating function of the dimension measuring SEM system are surrounded by broken lines. A resist pattern is formed by, for example, photolithography on a wafer 507 mounted on a stage 509. A SEM image of the resist pattern is formed. A primary electron beam 502 emitted by an electron gun 501 travels via a beam deflector 504, an ExB deflector 505 and an objective lens 506 and falls on the wafer 507 mounted on the stage 509. Then, the wafer 507 produces secondary electrons.

The ExB deflector 505 deflects the secondary electrons produced by the wafer 507 and a secondary electron detector 508 detects the secondary electrons. A two-dimensional electron beam image, namely, a SEM image is formed by two-dimensional scanning with the primary electron beam 502 deflected by the deflector 504 or repetitive scanning in an X-direction by the electron beam deflected by the ExB deflector 505, and the detection of electrons produced by the wafer 507 provided with the resist pattern in synchronism with the continuous movement in a Y-direction of the stage 509 supporting the wafer 507 thereon. An A/D converter 510 converts a detection signal provided by the secondary electron detector 508 into a corresponding digital signal and sends the digital signal to an image processing unit 511. The image processing unit 511 has an image storage device 513 for temporarily storing a digital image represented by the digital signal, and a CPU 512 for calculating indices for OPC evaluation by using the image stored in the image storage device 513.

A workstation 515 performs general control operations. Necessary operations of devices, exposure simulation (FIG. 13), and the confirmation of an OPC evaluation point input picture and calculated OPC evaluation indices can be achieved by a GUI. The storage device 514 and the workstation 515 are connected to an external network 516 to exchange data with external deices. The calculated OPC evaluation indices stored in the storage device 514 is fed back through the network 516 to the photomask designing unit 511 and the exposure system 519.

Design data 601 on a design mask pattern provided by the CAD system, not shown, or the photomask designing unit 517 is stored in the storage device 514. Consequently, the image processing unit 511 can calculate the evaluation indices.

Calculation of Evaluation Indices

Evaluation indices to be calculated by the image processing unit 511 for detailed OPC evaluation will be described. Evaluation indices indicating the geometrical features of a resist pattern representing the quality of the resist pattern is needed in addition to the well-known dimensional measurement of the resist pattern, namely, the measurement of widths of lines forming the resist pattern.

Figure 6:
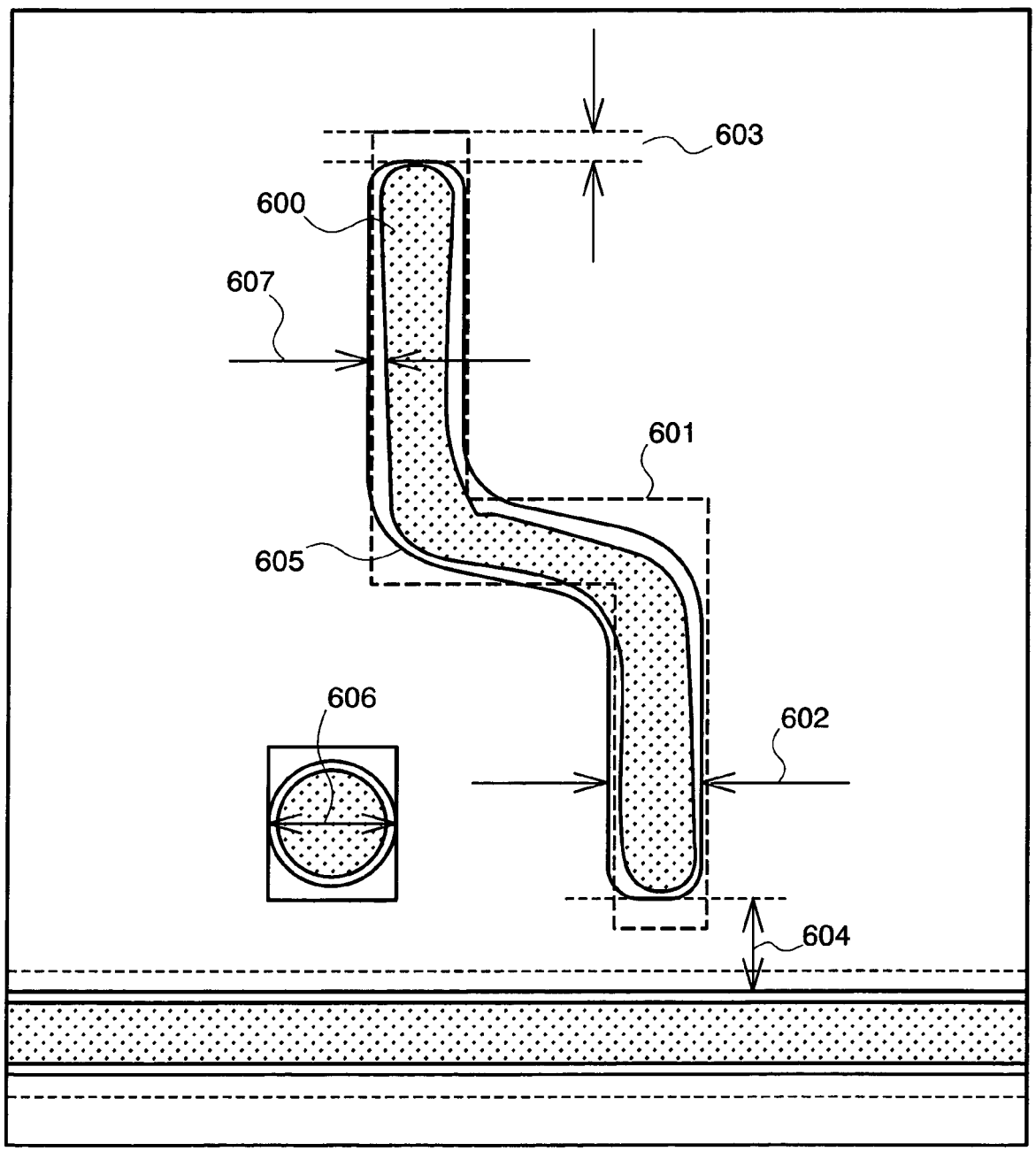
FIG. 6 is a pictorial view of assistance in explaining OPC evaluation indices according to the present invention.

FIG. 6 shows evaluation indices by way of example. Referring to FIG. 6, a superposed image formed by superposing a SEM image 600 of a resist pattern stored in the image storage device 513 and a design circuit pattern 601 defined by design data stored in the storage device 514 is displayed on a display screen placed in the workstation 515. Evaluation indices 810 (FIG. 8) for OPC evaluation are, for example, a CD 602, a GAP 603, an interpattern distance 604, a rounding degree 605 of a corner (shape index) and a hole size 606.

CDs 602 are the widths of lines forming the resist pattern. GAP 603 is the distance between a design position of an end part of a resist pattern and an actual position of the same end part receded from the design position due to OPE. Interpattern distance 604 is the distance between the adjacent circuit patterns. Rounding degree 605 is the degree of rounding of a corner of the resist pattern. Hole size 606 is the radius of a round hole or the major and the minor axis of an elliptic hole. These evaluation indices are only examples and any evaluation indices indicating the geometrical features of the resist pattern may be used.

If the deviation of anyone of evaluation indices including a CD 602, a GAP 603, an interpattern distance 604, a rounding degree 605 of a corner and a hole size 606 from a design value is greater than a tolerance, it is possible that the device characteristics of a semiconductor device having a circuit formed by using the circuit pattern differ from desired device characteristics, the circuit malfunctions, the circuits on different layers of the semiconductor device are connected faultily and the circuit malfunctions. The present invention evaluates the quality of the resist pattern on the basis of the evaluation indices for detailed OPC evaluation.

GUI Display

Description will be made of input and output GUIs in, for example, the workstation 515 of the pattern measuring SEM system shown in FIG. 5, namely, a measuring instrument, for carrying out the method of OPC evaluation.

Input Picture: Input of Measurement Points

An input picture displayed by a measuring instrument for OPC evaluation will be described by way of example. That parts of a circuit pattern slight deviations of shapes of which from corresponding desired shapes cause fatal defects in device characteristics and unstable, fragile parts of a resist pattern susceptible to the variation of process conditions need to be inspected and evaluated. Those parts needing inspection and evaluation will be called fatal points. Fatal points are parts, having small process margin for forming a pattern that exhibits desired device characteristics that can be calculated through exposure simulation at the stage of designing a mask pattern. Positional information about the calculated fatal points on CAD data is stored in the storage device 514. When a resist pattern is evaluated after exposure, some or all of the fatal points are chosen as evaluation points.

Figure 7:
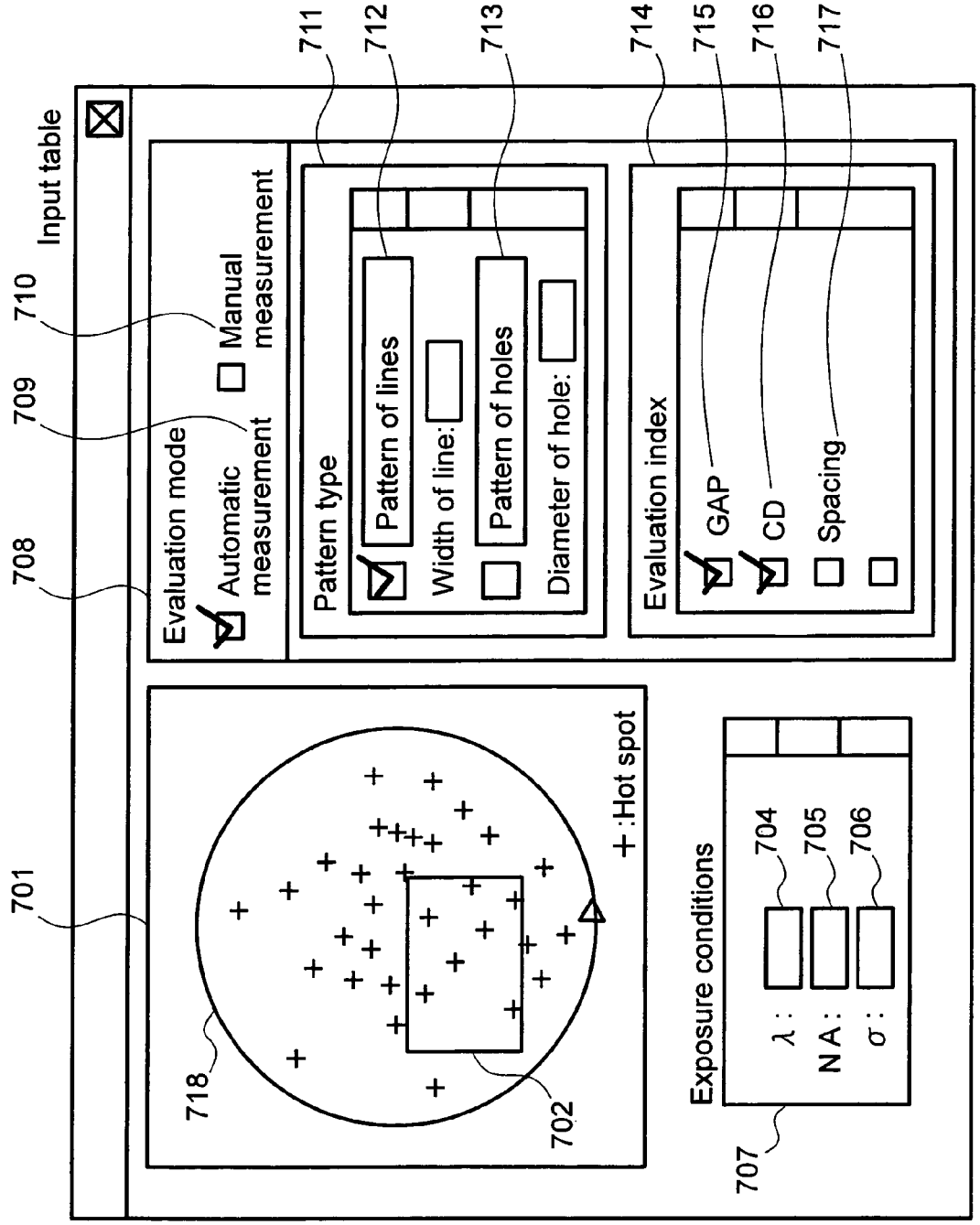
FIG. 7 is a pictorial view of a graphical user interface (abbreviated to "GUI") (input picture), according to the present invention.

FIG. 7 shows an input picture to be displayed for the user is shown in FIG. 7 by way of example. The input picture shown in FIG. 7 includes a GUI 701 for assistance in choosing fatal points. A picture 718 of fatal points on design data is shown in GUI 701. An evaluation area 702 containing all or some of fatal points can be specified in the GUI 701. The input picture has an input GUI 707 for entering exposure conditions, including the wavelength λ of exposure light, the numerical aperture NA of the objective lens, the apparent size σ of the light source and at least one of conditions related with defocus, for simulation to achieve accurate matching of design data and a SEM image.

The input picture has also an evaluation mode choosing picture 708. When an automatic measurement mode 709 is chosen, evaluation indices are calculated automatically from fatal points in the specified evaluation area 702. Optionally selected fatal points in the specified evaluation area 702 can be evaluated by specifying a measurement pattern type 711. For example, a measurement pattern type, namely, a line pattern 712 or a hole pattern 713, and measurement size, such as the widths of lines or the diameters of holes, can be specified. When the manual measurement mode 710 in the evaluation mode choosing picture 708 is chosen, fatal points to be measured and evaluation indices 714 can be manually specified. Thus OPC evaluation parts can be specified in the input picture.

Figure 8:
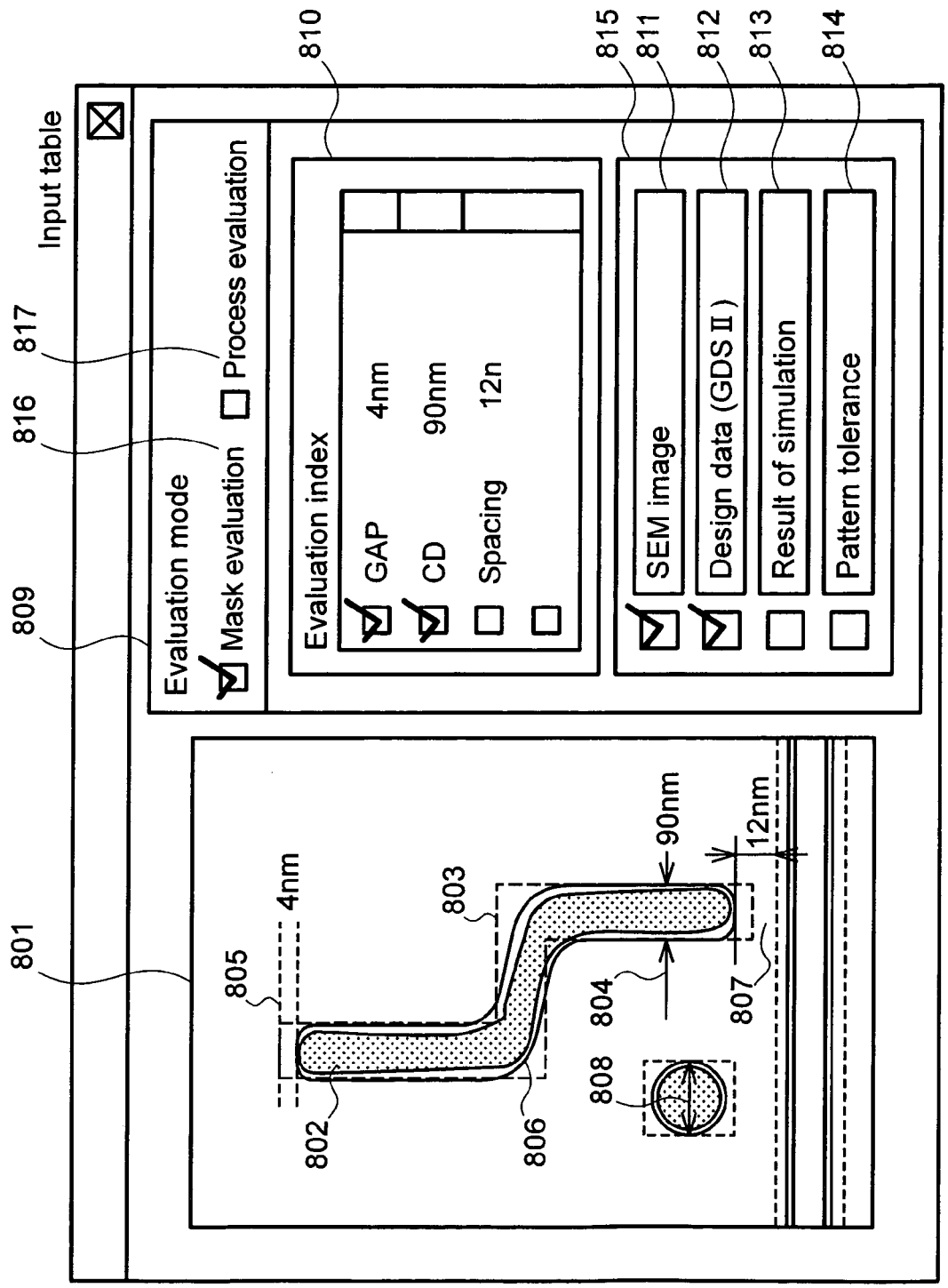
FIG. 8 is a pictorial view of a picture (output picture) displayed by the GUI according to the present invention.

Output Picture: SEM-CAD Data Superposition and Evaluation Indices Indicating Method An evaluation indices indicating method of showing the calculated OPC evaluation indices to the user will be described. FIG. 8 shows a GUI output picture showing evaluation indices to be displayed on the screen of the workstation 515 by way of example. The present invention has an OPC evaluation information displaying function to display OPC evaluation information including all or some of displaying functions shown in FIG. 8. The output picture includes a SEM image 802 of a resist pattern, a design pattern 803 defined by design pattern data, results of simulation, and a GUI 801 indicating all or some of pattern tolerances in superposed images. The SEM image 802 is an image formed by measuring evaluation points of a resist pattern by the dimension measuring SEM system and stored in the image storage device 513.

The design data 803 is superposed on the SEM image 802 on the basis of the result of superposition of the resist pattern and the SEM image 802 by the method illustrated in FIG. 3. The exposure simulator included in the workstation 515 shows the result of simulation in a superposed image of simulated circuit pattern 302 calculated on the basis of the mask pattern 301 and exposure conditions by the exposure simulator included in the workstation 515, and the SEM image 303.

Figure 9:
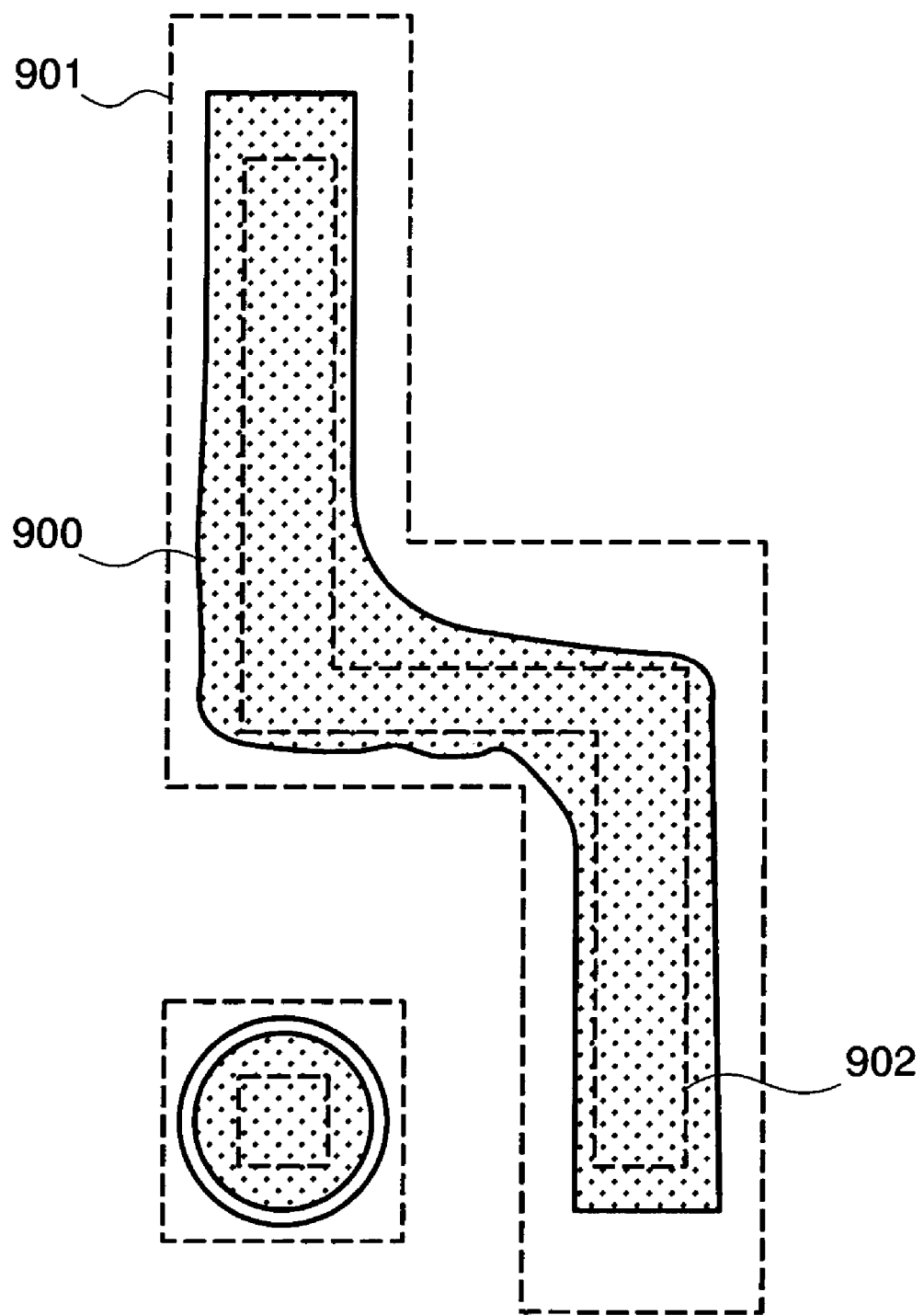
FIG. 9 is a pictorial view of assistance in explaining a tolerance according to the present invention.

The GUI a picture formed by superposing a SEM image of the resist pattern, a maximum permissible pattern 901 and a minimum permissible pattern 902 as shown in FIG. 9 to facilitate recognizing pattern tolerances as OPC evaluation indices. The GUI 801 shown in FIG. 8 is also capable of displaying an image formed by superposing measurement points. Evaluation indices to be calculated for the measurement points, such as a CD 804, a GAP 805, an interpattern distance 807, a rounding degree 806 of a corner and a hole size 808, can be displayed in a partly or totally superposed image. All or selected one of evaluation indices, measurement points and measurements can be displayed.

The output picture has also an evaluation mode choosing picture 809. When a photomask evaluation mode 816 is chosen, the calculated OPC evaluation indices are fed back to the photomask designing unit 517. When a process evaluation mode 817 is chosen, the calculated OPC evaluation indices are regarded as variations in the exposure conditions and, if the variations are greater than tolerances, an alarm signal is provided. A GUI 810 is used to specify evaluation indices to be calculated. Specified evaluation indices for the evaluation points determined by using the input picture are calculated.

The calculated evaluation indices are displayed on the output picture. A GUI 815 is used to specify data to be displayed. Data that can be displayed in the GUI 815 are, for example, a SEM image 811, design data 812, simulation results 813 and pattern tolerances 814. The calculated evaluation indices are shown in the output picture or are stored in a storage medium. Thus the calculated OPC evaluation indices are displayed in the GUI.

Process Evaluation

Figure 10:
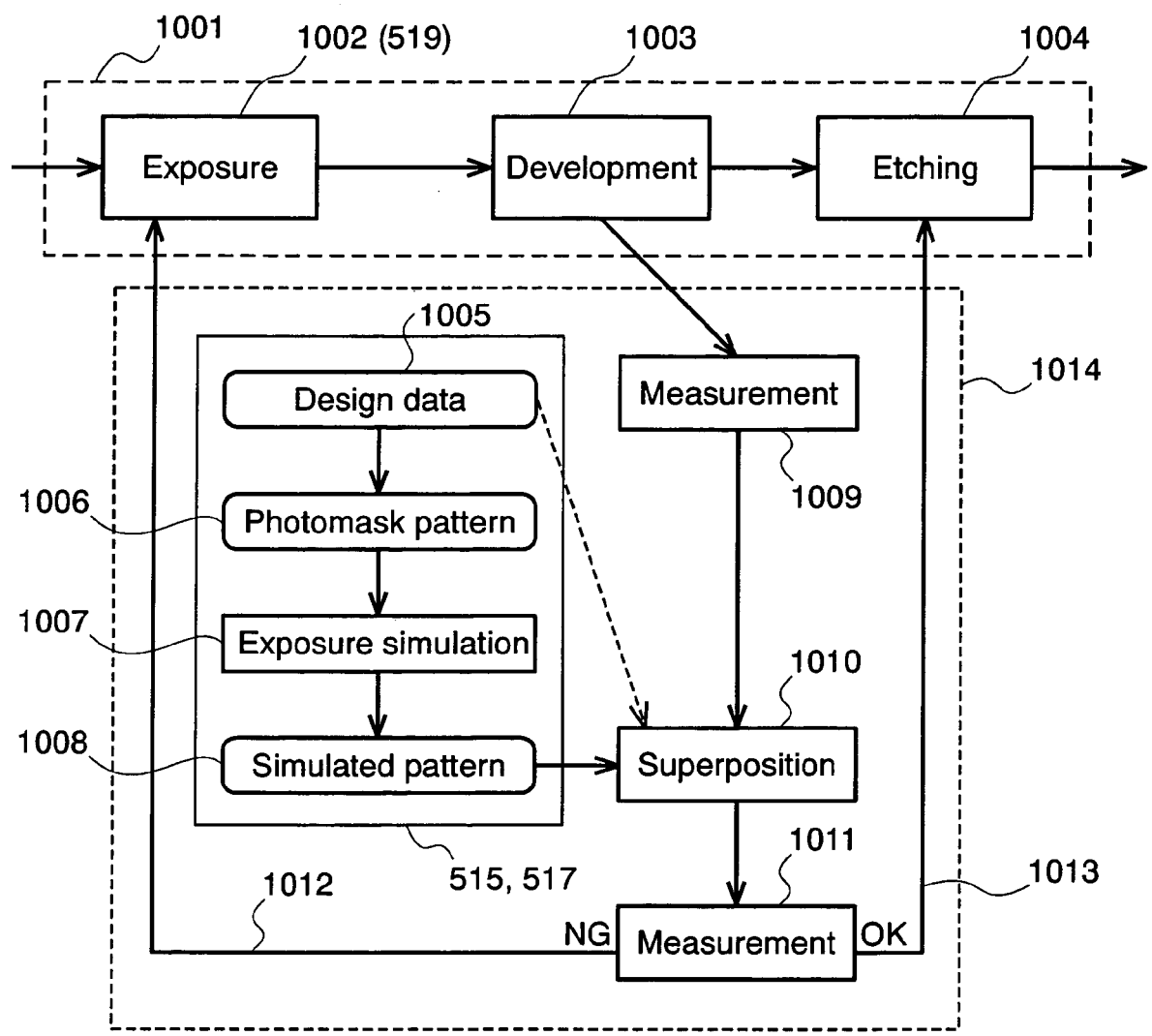
FIG. 10 is a block diagram of a process evaluation procedure using evaluation indices according to the present invention.

A method of using the evaluation indices for process evaluation will be explained. In a mass-production line, deviation of parts of the SEM image of the resist pattern from the corresponding parts of a design pattern defined by the design data are quantitatively indicated by evaluation indices. FIG. 10 is a block diagram of a process evaluation procedure using evaluation indices. A semiconductor device fabricating process 1001 includes an exposure step 1002, a developing step 1003 and an etching step 1004.

In a measuring step 1009, the dimension measuring SEM system measures a resist pattern formed on a wafer processed after the completion of the developing step 1003 and forms a SEM image of the resist pattern. In a superposing step 1010, the SEM image of the measured resist pattern is superposed on a design mask pattern 1006 defined by design data 1005. The superposing, step 1010 is similar to the method illustrated in FIG. 3. Differences of the superposed design data from the SEM image of the resist pattern are calculated. The calculated differences are used as evaluating values for evaluating the quality of the resist pattern. The quality of the resist pattern is evaluated on the basis of the evaluating values in an evaluating step 1011. When the formed resist pattern meets criteria, a step 1013 is executed. If the resist pattern does not meet the criteria for evaluation, the calculated differences are given to the exposure system 519 by a feedback operation 1012 to modify the exposure conditions or the evaluating values are given to the photomask designing unit 517 to modify the photomask design data. A reference numeral 1014 indicates the dimension measuring SEM system (the circuit pattern evaluating system) of the present invention having the OPC evaluating function.

Figure 12:
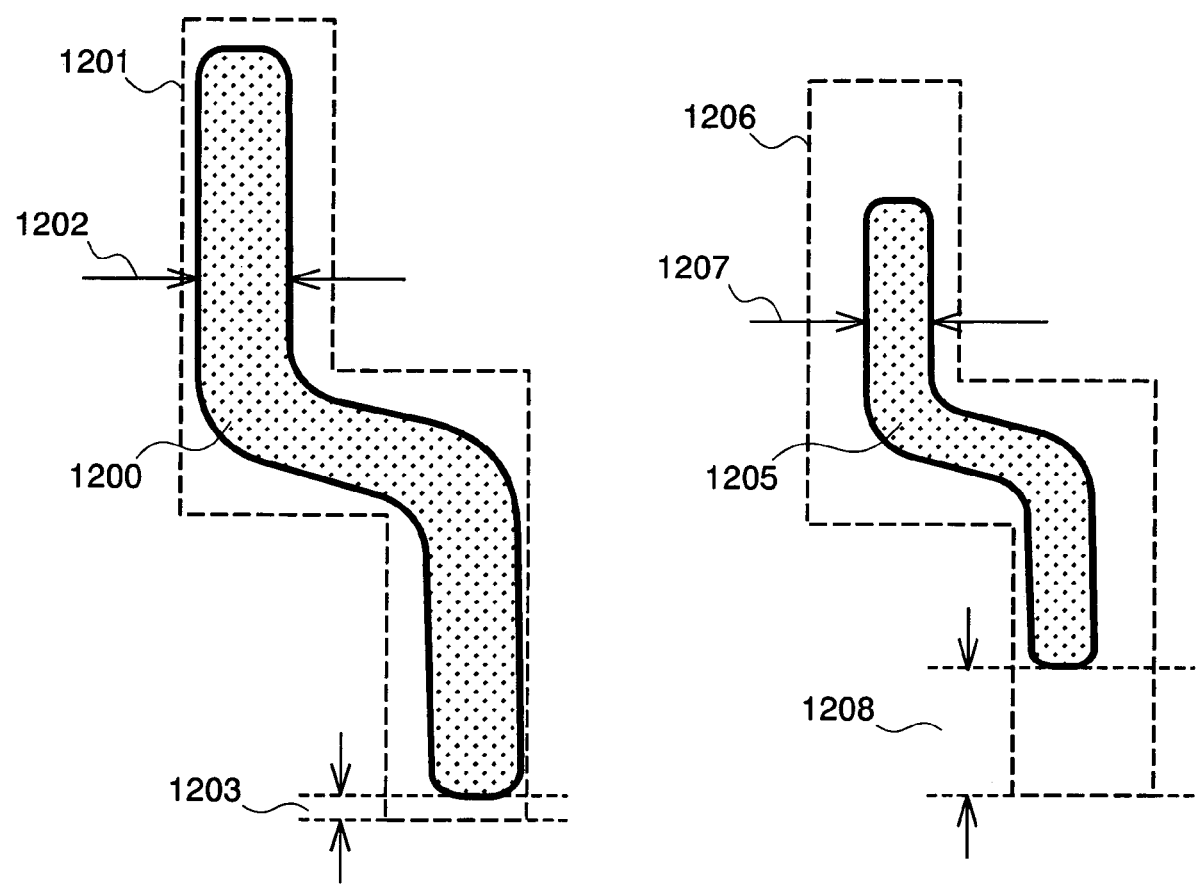
FIG. 12 is a pictorial view of assistance in explaining a proves evaluation using evaluation indices according to the present invention.

The criteria for evaluation are references for deciding whether or not the deviations of parts of the actual resist pattern from the corresponding parts of the design mask pattern defined by the design data are within the corresponding tolerances that ensure the normal operation of a circuit including a circuit pattern formed by using the resist pattern. FIG. 12 shows a resist pattern 1200 represented by evaluation indices within tolerances and a resist pattern 1205 represented by evaluation indices outside the tolerances by way of example. In the example shown in FIG. 12, the CD 1202 and the GAP 1203 are calculated. If deviations of parts of a resist pattern 1205 from corresponding parts of a design mask pattern 1206 defined by the design data are large and the CD 1207 and the GAP 1208 are outside the corresponding tolerances, it is decided that the resist pattern 1205 is unacceptable and the wafer provided with the unacceptable resist pattern is not sent to the next process. Then, a warning is given to warn the operator that the exposure conditions are inadequate and a defective resist pattern is formed. Information about the results of evaluation of the defective parts is displayed on the GUI. Names of the evaluation indices and evaluation indices are displayed.

The operator corrects the exposure conditions defining the exposure process to be executed by the exposure system 519 with reference to the information about the results of evaluation. Thus the resist pattern can be minutely evaluated, the yield of mass-produced wafers can be improved, the calculated, detailed evaluation indices can be displayed on the GUI, the process can be efficiently evaluated and the load on the operator can be reduced.

Superposition of Design Patterns

Figure 11:
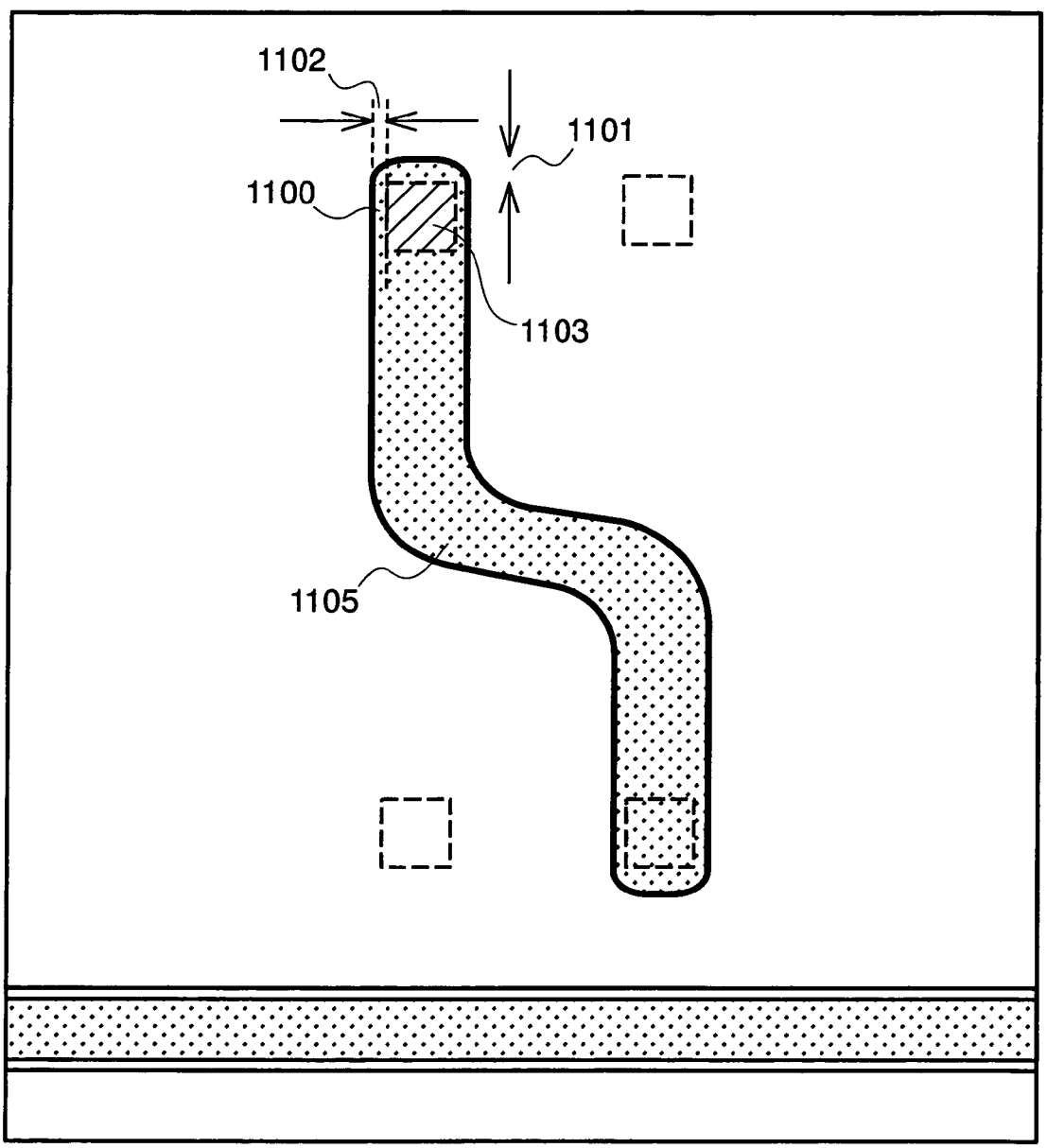
FIG. 11 is a pictorial view of assistance in explaining design data superposition according to the present invention.

Description will be made of a method of OPC evaluation in the present step (evaluating step) using measured data on the design pattern in the preceding or the succeeding step for OPC evaluation. Generally, a plurality of layered circuits are formed on a wafer. The circuit patterns on the different circuit layers need to be electrically connected to form a semiconductor device. The positional relation between the circuit patterns formed respectively by different circuit pattern forming processes is important. FIG. 11 shows parts of circuit patterns formed on different circuit layers by way of example.

Referring to FIG. 11, a resist pattern 1105 represented by a SEM image is connected to a via hole 1100 formed in the succeeding process. The positional difference between the resist pattern 1105 and the via hole 1100 must be with in a tolerance. The OPC evaluating method of the present invention superposes a design pattern for the following process on the SEM image of the resist pattern to evaluate the connection of the circuit patterns on the different circuit layers. The superposition of the design pattern defined by the design data and the SEM image of the resist pattern is achieved by the foregoing superposing method to superpose the object resist pattern and the design data for the same layer on the resist pattern. The positional relation between the circuit patterns formed respectively on the different layers is included in the design data. Therefore, the design pattern defined by the design data for the following process can be superposed on the SEM image of the object resist pattern by replacing the design data with the design data for the layer to be processed by the preceding or succeeding process on the basis of the result of superposition of the resist pattern and the design data for the same layer.

Evaluation indices include distances 1101 and 1102 between an end part 1100 of the resist pattern and a design pattern 1100 defined by the design data and the area 1103 of an overlapping part. The evaluation indices are examined to see if the evaluation indices are within the corresponding tolerances. Thus OPC evaluation can be achieved taking into consideration the connection of the patterns on the different layers.

As apparent from the foregoing description, the present invention provides the dimension measuring SEM system capable of evaluating the shape of a pattern formed by lithography, proposes evaluation indices important for the miniaturization of design patterns for semiconductor devices, and provides a method of showing the operator the evaluation indices and a method of using the evaluation indices.

The present invention achieves the accurate, minute OPC evaluation the importance of which is expected to increase with the miniaturization of design patterns for semiconductor devices, shows the result of evaluation so that the operator may be easily understand the results of evaluation to improve the efficiency of evaluation, and contributes to the early start of production of a variety of semiconductor devices in small lots. Thus the present invention has very high industrial applicability.

The invention may be embodied in the specific forms without departing from the spirit or essential characteristics thereof. The present invention embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

DRAWINGS

FIG. 2

200: Design data, 201: Mask formation, 202: Exposure, 203: Measurement, 204: Retrieval and collation, 205: Mask formation, 206: Exposure simulation,

FIG. 3

1 (300) . . . Design data, 2 (301) . . . Mask pattern, 3 (302) . . . Simulated pattern (Result of simulation), 4 (303) . . . Resist pattern

FIG. 4

1 . . . Light intensity

FIG. 5

501: Electron gun, 502: Secondary electron beam, 503: Condenser lens, 504: Deflector, 505: ExB deflector, 506: Objective lens, 507: Wafer, 508: Secondary electron detector, 509: Stage, 510: A/D converter, 511: Image processing unit, 513: Image storage device, 519: Exposure system, 520: Controller, 517: Mask design processing unit

FIG. 7

707: Exposure conditions, 708: Evaluation mode, 709: Automatic measurement, 710: Manual measurement, 711: Pattern type, 712: Pattern of lines, 713: Pattern of holes, 714: Evaluation index, 715: GAP, 716: CD, 717: Spacing 1 . . . Input list, 2 . . . Hot spot, 3 . . . Diameter of hole

FIG. 8

809: Evaluation mode, 810: Evaluation index, 811: SEM Image, 812: Designd data (GDSII), 813: Result of simulation, 814: Pattern tolerance, 816: Mask evaluation, 817: Process evaluation 1 . . . Input table

FIG. 10

1002: Exposure, 1003: Development, 1004: Etching, 1005: Design data, 106: Photomask pattern, 107: Exposure simulation, 108: Simulated pattern, 1009: Measurement, 1010: Superposition, 1011: Measurement

FIG. 13

1307: Illumination, 1309: Mask, 1310: Luminance distribution on mask (?), 1311: Condition of illumination through mask (?), 1313: Pupil plane (Aberration/pupil) (?), 1314: Intensity distribution on pupil plane, 1315: Condition of illumination through pupil plane, 1317: Light intensity distribution

What is claimed is:

1. A scanning electron microscope system comprising:
input means for inputting pattern design data of a pattern to be formed on a photomask designed by taking an optical proximity effect into account;

SEM image acquiring means for acquiring a SEM image of a resist pattern formed by exposing a resist film coated on a surface of a substrate with light through the photomask;

simulating means for simulating a circuit pattern to be formed on a substrate by using the pattern design data inputted by the input means;

superposing means for superposing the SEM image of the resist pattern formed by the SEM image acquiring means and the simulated circuit pattern formed by the simulating means;

geometrical feature extracting means for extracting one- or two-dimensional geometrical features indicating differences between the superposed SEM image and the simulated circuit pattern; and evaluating index calculating means for calculating evaluation indices for evaluating a correction of the optical proximity effect of the mask pattern formed on the photomask by using information about the one- or two-dimensional geometrical features provided by the feature extracting means.

2. The dimension measuring scanning electron microscope system according to claim 1, wherein the geometrical features to be extracted by the feature extracting means includes all or some of widths of component lines of a circuit pattern, distance between a design position of an end part of the circuit pattern and an actual position of the same end part of the circuit pattern receded from the design position, interpattern distance between adjacent circuit patterns, rounding degree of a corner of the circuit pattern, radius of a circular pattern in the circuit pattern, ratio between major and minor axes of an elliptic pattern in the circuit pattern, and area of the circuit pattern.

3. The dimension measuring scanning electron microscope system according to claim 1 further comprising an exposure simulator including an input means for entering design data on the exposure circuit pattern and exposure conditions and capable of calculating data on a transfer circuit pattern to be formed when the substrate is exposed to design data on the exposure circuit pattern on the basis of the design data on the exposure circuit pattern and the exposure conditions entered by the input means, wherein the evaluation index calculating means calculates data on the positional relation between the transfer circuit pattern and the SEM image of the exposure circuit pattern by subjecting the data on a transfer circuit pattern obtained by the exposure simulator and the SEM image of the exposure circuit pattern to an aligning process, and the design data on the exposure circuit pattern and the data on the SEM image of the exposure circuit pattern are superposed by replacing the calculated data on the transfer circuit pattern with the design data on the exposure circuit pattern.

4. The dimension measuring scanning electron microscope system according to claim 3, wherein the calculated data on the simulated circuit pattern calculated by the exposure simulator is data on a shape of a section formed by cutting a light intensity distribution on a plane corresponding to a proper light intensity or data on a shape of a section in close resemblance with the SEM image of the mask pattern among shapes of sections formed by cutting the light intensity distribution on planes corresponding to different light intensities respectively.

5. The dimension measuring scanning electron microscope system according to claim 1, wherein the evaluation index calculating means includes a display means for displaying an image formed by superposing part of or all the images defined by the data on the SEM image of the mask pattern and the design data on the mask pattern.

6. The dimension measuring scanning electron microscope system according to claim 1, wherein the evaluation index calculating means includes a display means for displaying quantities of some of or all the geometrical features.

7. A circuit pattern evaluating system comprising:
input means for inputting design data on a mask pattern formed on a photomask;
SEM image acquiring means for acquiring a SEM image of a resist pattern formed by exposing a resist film coated on a substrate with light through the photomask on which the mask pattern is formed;
simulating means for simulating a pattern to be formed on the substrate by using the inputted design data on the mask pattern;
matching means for superposing the SEM image of the resist pattern acquired by the SEM image acquiring means and the pattern simulated by the simulating means;
resist pattern evaluating means for evaluating a quality of the resist pattern by determining differences between the superposed SEM image of the resist pattern and the simulated pattern; and
display means for displaying information obtained by the resist pattern evaluating means on a screen.

8. The circuit pattern evaluating system according to claim 7 the resist pattern evaluating means evaluates the resist pattern in terms of all or some of widths of component lines of a circuit pattern, distance between a design position of an end part of the circuit pattern and an actual position of the same end part of the circuit pattern receded from the design position, interpattern distance between adjacent circuit patterns, rounding degree of a corner of the circuit pattern, radius of a circular pattern in the circuit pattern, ratio between major and minor axes of an elliptic pattern in the circuit pattern, and area of the circuit pattern.

9. The circuit pattern evaluating system according to claim 7, wherein the simulating means calculates a light intensity distribution when the mask pattern is used for exposure, and uses a shape of a section formed by cutting the light intensity distribution on a plane corresponding to a proper light intensity or a shape of a section in close resemblance with a measured image of the mask pattern among shapes of sections formed by cutting the light intensity distribution on planes corresponding to different light intensities respectively, as a simulated circuit pattern.

10. The circuit pattern evaluating system according to claim 7, wherein the display means displays an image formed by partly or totally superposing the SEM image of the resist pattern and the simulated circuit pattern formed by the simulating means by the matching means.

11. The circuit pattern evaluating system according to claim 7 further comprising a warning means for giving a warning when deviations of parts of the SEM image of the resist pattern from corresponding parts of the simulated circuit pattern representing the quality of the resist pattern are outside corresponding tolerances.

12. A circuit pattern evaluating method comprising the steps of:
inputting design data of a pattern to be formed on a photomask by taking an optical proximity effect into account;
acquiring a SEM image of a resist pattern formed by exposing a resist film coated on a substrate with light through a photomask on which a mask pattern is formed by using the design data of the pattern;
simulating a circuit pattern to be formed on the substrate from the inputted design data of the photomask;
superposing the SEM image of the resist pattern and the simulated circuit pattern;
extracting one- or two-dimensional geometrical features indicating differences between the SEM image and the simulated circuit pattern from the superposed SEM image and the simulated circuit pattern; and
calculating evaluation indices for evaluating a corrected optical proximity effect of the mask pattern formed on the photomask by using information on the one- or two-dimensional geometrical features extracted by the step of extracting one- or two-dimensional geometrical features.

13. The circuit pattern evaluating method according to claim 12, wherein the information about the geometrical features used by the step of calculating the evaluation indices includes all or some of widths of component lines of a circuit pattern, distance between a design position of an end part of the circuit pattern and an actual position of the same end part of the circuit pattern receded from the design position, interpattern distance between adjacent circuit patterns, rounding degree of a corner of the circuit pattern, radius of a circle in the circuit pattern, ratio between major and minor axes of an elliptic pattern in the circuit pattern, and area of the circuit pattern.

14. The circuit pattern evaluating method according to claim 12, the step of entering the design data enters also exposure conditions for exposing the substrate to exposure radiation, and the step of forming a simulated circuit pattern forms a simulated pattern that is expected to be formed on the substrate when the mask pattern defined by the entered design data on the design mask pattern and the exposure conditions are used for exposure.

15. The circuit pattern evaluating method according to claim 14, wherein the exposure conditions entered in the step of entering the design data includes wavelength of exposure radiation, numerical aperture of an objective lens, apparent size of a light source and at least one of pieces of information about defocus.

16. A circuit pattern evaluating method comprising the steps of:
inputting design data on a mask pattern to be formed on a photomask;
acquiring a SEM image of a resist pattern formed by exposing a resist film coated on a substrate with light through a photomask on which the mask pattern is formed;
simulating a circuit pattern to be formed on the substrate by using the inputted design data on the mask pattern;
superposing the SEM image of the resist pattern and the simulated circuit pattern;
evaluating a quality of the resist pattern on the basis of differences between the SEM image and the simulated circuit pattern derived from the superposed SEM image and the simulated circuit pattern; and
displaying results of evaluation of the quality of the resist pattern.

17. The circuit pattern evaluating method according to claim 16, wherein the step of evaluating the quality of the resist pattern evaluates the resist pattern in terms of all or some of widths of component lines of a circuit pattern, distance between a design position of an end part of the circuit pattern and an actual position of the same end part of the circuit pattern receded from the design position, interpattern distance between adjacent circuit patterns, rounding degree of a corner of the circuit pattern, radius of a circular pattern in the circuit pattern, ratio between major and minor axes of an elliptic pattern in the circuit pattern, and area of the circuit pattern.

18. The circuit pattern evaluating method according to claim 16, wherein the step of forming a simulated circuit pattern calculates a light intensity distribution when the mask pattern is used for exposure, and uses a shape of a section formed by cutting the light intensity distribution on a plane corresponding to a proper light intensity or a shape of a section in close resemblance with a measured image of the mask pattern among shapes of sections formed by cutting the light intensity distribution on planes corresponding to different light intensities respectively, as a simulated circuit pattern.

19. The circuit pattern evaluating method according to claim 16, wherein the step of displaying results of evaluation of the quality of the resist pattern displays an image formed by partly or totally superposing the SEM image of the resist pattern and the simulated circuit pattern formed by the simulating means by the matching means.

20. The circuit pattern evaluating method according to claim 16, wherein the step of evaluating the quality of the resist pattern gives a warning when deviations of parts of the SEM image of the resist pattern from corresponding parts of the simulated circuit pattern representing the quality of the resist pattern are outside corresponding tolerances.

\* \* \* \* \*